(12) United States Patent
Cho

(10) Patent No.: US 11,630,129 B2
(45) Date of Patent: Apr. 18, 2023

(54) PROBE CARD FOR TESTING WAFER

(71) Applicant: PRO-2000 Co., LTD, Gyeonggi-do (KR)

(72) Inventor: Jun Soo Cho, Seoul (KR)

(73) Assignee: PRO-2000 Co., LTD, Gyeonggi-do (KR)

( * ) Notice: Subject to any disclaimer, the term of this patent is extended or adjusted under 35 U.S.C. 154(b) by 0 days.

(21) Appl. No.: 17/504,693

(22) Filed: Oct. 19, 2021

(65) Prior Publication Data
US 2022/0128602 A1 Apr. 28, 2022

(30) Foreign Application Priority Data
Oct. 26, 2020 (KR) .......................... 10-2020-0139189

(51) Int. Cl.
| | | |
|---|---|---|
| G01R 1/02 | (2006.01) |
| G01R 1/04 | (2006.01) |
| G01R 1/067 | (2006.01) |
| G01R 1/073 | (2006.01) |
| G01R 31/20 | (2006.01) |
| G01R 31/26 | (2020.01) |
| G01R 31/27 | (2006.01) |

(52) U.S. Cl.
CPC ..... *G01R 1/07342* (2013.01); *G01R 1/07378* (2013.01)

(58) Field of Classification Search
CPC . G01R 1/02; G01R 1/04; G01R 1/067; G01R 1/073; G01R 31/20; G01R 31/26; G01R 31/27
See application file for complete search history.

(56) References Cited

U.S. PATENT DOCUMENTS 8,149,008 B2 * 4/2012 Yamada ............. G01R 31/2891
324/754.01

FOREIGN PATENT DOCUMENTS

| CN | 110531125 | * 5/2022 | ............. G01R 1/073 |
| KR | 10-2010-0057488 A | 5/2010 | |

* cited by examiner

*Primary Examiner* — Neel D Shah
(74) *Attorney, Agent, or Firm* — Harness, Dickey & Pierce, P.L.C.

(57) ABSTRACT

Disclosed is a probe card for testing a wafer. The probe card includes a substrate and a block including an insulation portion and a conducting portion disposed on the insulation portion. Here, the insulation portion includes a via and a probe pin which comes into contact with an object to be tested. The conducting portion includes a contact point electrically connected to the substrate and a conducting pattern passing through the via and electrically connecting the contact point to the probe pin. A pitch between a plurality of such probe pins is smaller than a pitch between a plurality of such contact points. The block includes a plurality of unit blocks. The plurality of unit blocks each include the insulation portion and the conducting portion, and at least parts of the insulation portions of the unit blocks are arranged while being spaced apart from each other.

5 Claims, 12 Drawing Sheets

PROBE CARD FOR TESTING WAFER

CROSS-REFERENCE TO RELATED APPLICATIONS

This application claims the benefit of the Korean Patent Applications No. 10-2020-0139189 filed on Oct. 26, 2020 which is hereby incorporated by reference as if fully set forth herein.

TECHNICAL FIELD

Embodiments relate to a probe card for testing a wafer.

BACKGROUND ART

A probe card is a device configured to connect a semiconductor chip to test equipment in a wafer state before packing. The probe card includes a plurality of probe pins which come into physical contact with a wafer. The probe card sends an electrical signal to the wafer through the probe pin and receives a returning electrical signal.

As the degree of integration of semiconductor devices has increased and miniaturization thereof has been developed, a pitch of a contact pad of the wafer decreases and the probe card also becomes smaller and miniaturized corresponding thereto. An interval between the probe pins is formed to be very small in order to be applied to the fine pitch of the wafer.

Accordingly, a block compensating an interval difference between contact points of a printed circuit board and contact points of the probe pin is necessary. The block is disposed between the probe pin and the printed circuit board and includes an insulation portion and a conducting portion. The insulation portion secures a space for compensating the interval difference between the contact points of the printed circuit board and the contact points of the probe pin, and the conducting portion is disposed on the insulation portion and forms a path electrically connecting the contact point of the printed circuit board to the contact point of the probe pin.

The block generally includes a multilayer ceramic structure formed by stacking a plurality of ceramic sheets using a buildup method. The conducting portion or the insulation portion is disposed on each layer and the ceramic sheets are stacked so that the conducting portion and the insulation portion are dislocated and arranged alternately.

However, the block has problems such as a complicated manufacturing process, a large amount of manufacturing time and costs, and low productivity caused thereby. Also, when the block is partially damaged or has a defective part, it is necessary to replace the entire block and thus a cost increases.

SUMMARY

Technical Problem

The present invention is directed to providing a probe card which has a simplified manufacturing process and is partially replaceable so as to reduce a cost.

Aspects of the present invention are not limited to the above-stated aspect and other unstated aspects of the present invention will be understood by those skilled in the art from a following description.

Technical Solution

According to an aspect of the present invention, there is provided a probe card for testing a wafer. The probe card includes a substrate and a block including an insulation portion and a conducting portion disposed on the insulation portion. Here, the insulation portion includes a via and a probe pin which comes into contact with an object to be tested. The conducting portion includes a contact point electrically connected to the substrate and a conducting pattern passing through the via and electrically connecting the contact point to the probe pin. A pitch between a plurality of such probe pins is smaller than a pitch between a plurality of such contact points. The block includes a plurality of unit blocks. The plurality of unit blocks each include the insulation portion and the conducting portion, and at least parts of the insulation portions of the unit blocks are arranged while being spaced apart from each other.

In the block, the unit blocks having a bar shape may be arranged at certain intervals in a first direction.

The unit block may include a body and a plurality of extension portions diverging from the body in the first direction, and the probe pins may be disposed on the body and the plurality of extension portions.

The plurality of probe pins disposed on the body may be arranged in the second direction different from the first direction, and the plurality of probe pins disposed on the extension portions may be arranged in the first direction.

The plurality of unit blocks may have the same shape.

The unit blocks of the block may include a first unit block and a second unit block. A plurality of such first unit blocks may be arranged at certain intervals in a first direction. A plurality of such second unit blocks may be arranged at certain intervals in a second direction different from the first direction. Also, the first unit blocks and the second unit blocks may be arranged to intersect with each other.

The first unit blocks and the second unit blocks may be disposed so that intersection areas are overlapped with each other in a vertical direction.

The first unit block may include a first groove. The second unit block may include a second groove. Here, the first unit block and the second unit block may be disposed to intersect and match with each other so that the first groove is engaged with the second groove.

The plurality of probe pins arranged on the first unit block may be arranged in the second direction different from the first direction, and the plurality of probe pins arranged on the second unit block may be arranged in the first direction.

The unit block may include a first surface on which the probe pins and some of the conducting patterns are arranged and a second surface adjacent to the first surface. Here, ends of the probe pins may be disposed to protrude further than the second surface.

Advantageous Effects

According to the embodiments, a process of manufacturing a block of a probe card is simplified by forming the block as one member instead of a multilayer structure so as to greatly increase productivity of the probe card.

According to the embodiments, since a block is formed of a plurality of unit blocks so that the block is partially replaceable, a cost may be reduced.

DETAILED DESCRIPTION

Hereinafter, exemplary embodiments of the present invention will be described in detail with reference to the drawings.

However, the present invention is not limited to the embodiments disclosed below and can be implemented in a variety of forms. One or more of components of the embodiments may be selectively combined or substituted with one another without departing from the scope of the technical concept of the present invention.

Also, unless defined otherwise, the terms (including technical and scientific terms) used herein may be used as meanings commonly understandable by one of ordinary skill in the art. Also, terms generally used like terms defined in dictionaries may be construed in consideration of the contextual meanings of the related art.

Also, the terms used herein are intended to explain the embodiments but not intended to restrict the present invention.

In the specification, unless stated otherwise particularly, singular forms include plural forms. When at least one (or one or more) of A, B, and C is stated, one or more of all combinations formed of A, B, and C may be included.

Also, in describing components of the embodiments of the present invention, the terms such as first, second, A, B, (a), (b), and the like may be used.

These terms are merely for distinguishing one element from another, and the essential, order, sequence, and the like of corresponding elements are not limited by the terms.

Also, when it is stated that one element is "connected," or "coupled" to another, the element may not only be directly connected or coupled to the other element but may also be connected or coupled to the other element with another intervening element.

Also, when it is stated that an element is formed or disposed "above (on) or below (beneath)" another element, the two elements may not only come into direct contact with each other but also still another element may be formed or disposed between the two elements. Also, being "above (on) or below (beneath)" may include not only being in an upward direction but also being in a downward direction on the basis of one element.

Figure 1:
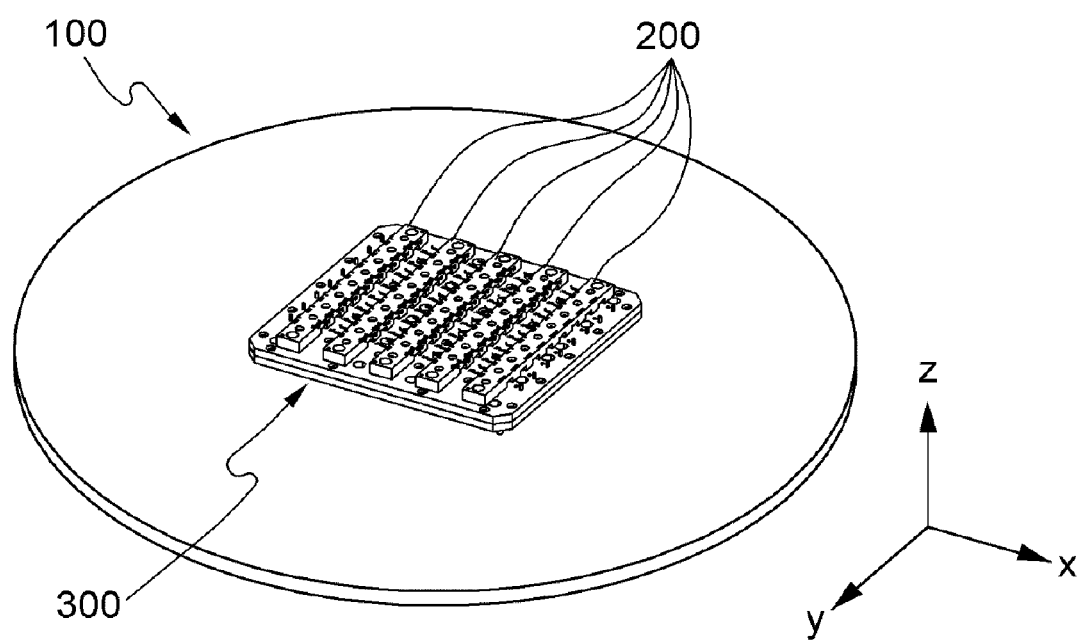
FIG. 1 is a view of a probe card according to an embodiment.
Figure 2:
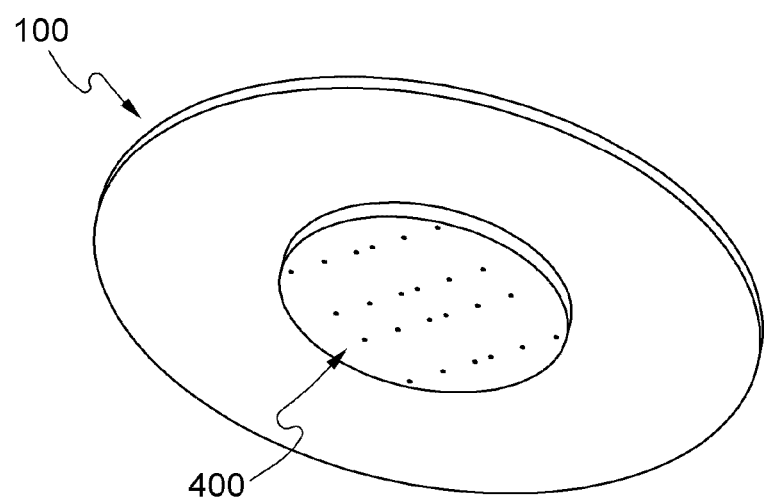
FIG. 2 is a bottom view of the probe card shown in FIG. 1.
Figure 3:
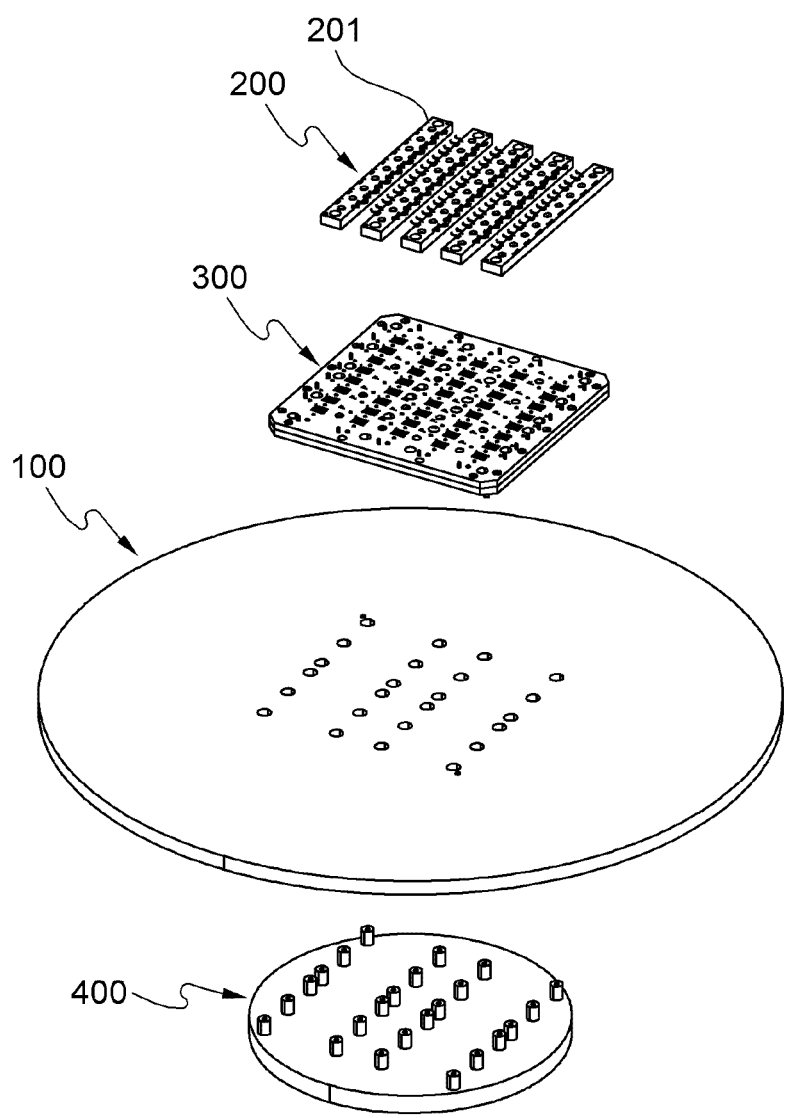
FIG. 3 is an exploded view of the probe card shown in FIG. 1.

FIG. 1 is a view of a probe card according to an embodiment, FIG. 2 is a bottom view of the probe card shown in FIG. 1, and FIG. 3 is an exploded view of the probe card shown in FIG. 1.

Hereinafter, throughout the drawings, an X-axis indicates a left-right direction of the probe card and equals a first direction, a Y-axis indicates a front-rear direction of the probe card and equals a second direction, and a Z-axis indicates a vertical direction of the problem card.

The probe card according to the embodiment may include a substrate 100, a block 200, and an interposer 300, and a reinforcing portion 400. In an order of from top to bottom, the block 200, the interposer 300, the substrate 100, the reinforcing portion 400 may be sequentially stacked and arranged.

The probe card according to the embodiment includes the block 200 for compensating a difference between a pitch of the contact points of the substrate 100 and a fine pitch of the contact points of the probe pin as one member so as to have a feature of very simplifying a process of manufacturing the block 200. Also, since the block 200 includes a plurality of unit blocks 200 to greatly reduce a material and a variety of such unit blocks 201 are detachably arranged on the interposer 300, it is possible to perform a test corresponding to a variety of pitches of contact points of an object to be tested.

Detailed components of the probe card will be described as follows.

First, on the basis of a vertical direction z, the interposer 300 may be disposed on one side of the substrate 100. Also, on the basis of a vertical direction z, the interposer 400 may be disposed on one side of the substrate 100.

The interposer 300 is disposed between the block 200 and the substrate 100 on the basis of the vertical direction z, electrically connects the block 200 to the substrate 100, and secures a space between the block 200 and the substrate 100.

The block 200 is stacked and disposed on one side of the interposer 300 in the vertical direction z. Since an interval between probe pins 212 is very smaller than an interval between the contact points of the substrate 100, it is necessary to electrically connect them while compensating an interval therebetween. The block 200 performs a function of electrically connecting the probe pin 212 to the substrate 100 while compensating the interval between the probe pins 212 and the interval between the contact points of the substrate 100.

The block 200 may include the plurality of unit blocks 201. The plurality of unit blocks 201 may be arranged at uniform intervals.

Figure 4:
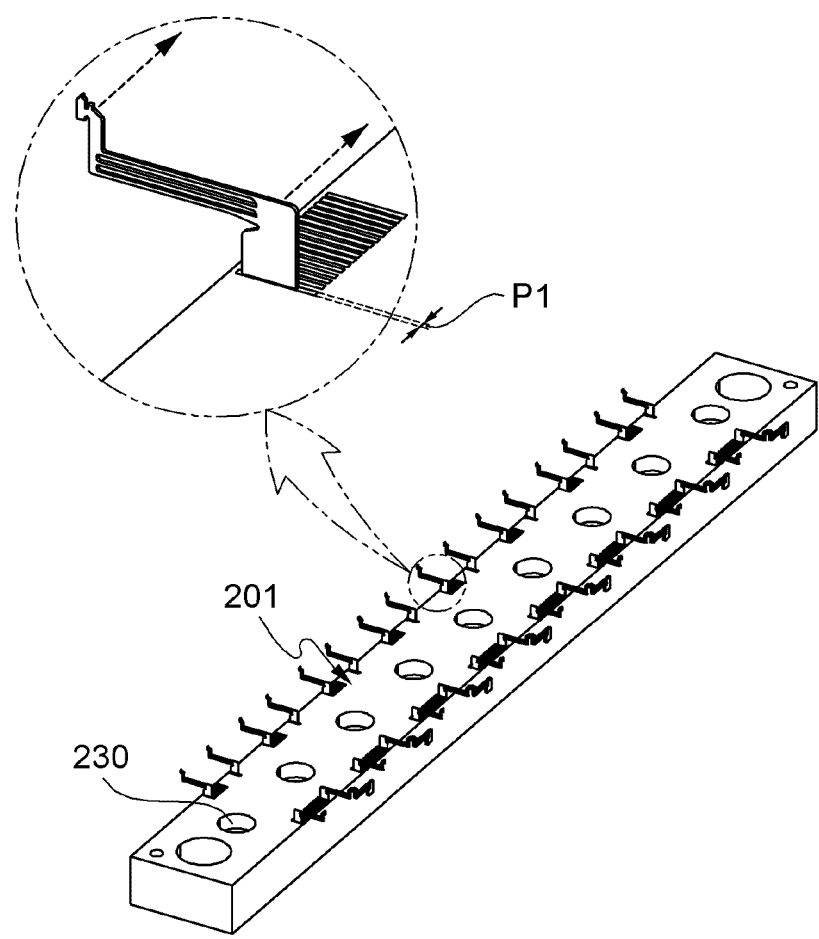
FIG. 4 is a view illustrating a unit block on which probe pins are arranged.
Figure 5:
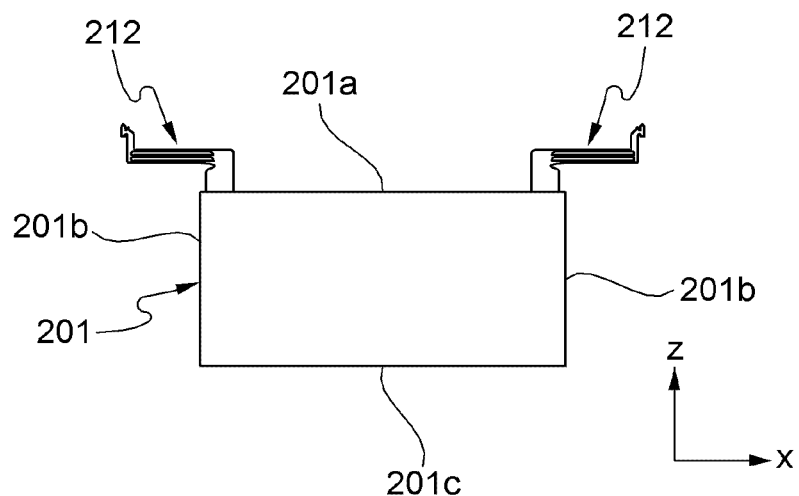
FIG. 5 is a front view illustrating the unit block shown in FIG. 4.

FIG. 4 is a view illustrating the unit block 201 on which the probe pins 212 are arranged, and FIG. 5 is a front view illustrating the unit block 201 shown in FIG. 4.

Figure 7:
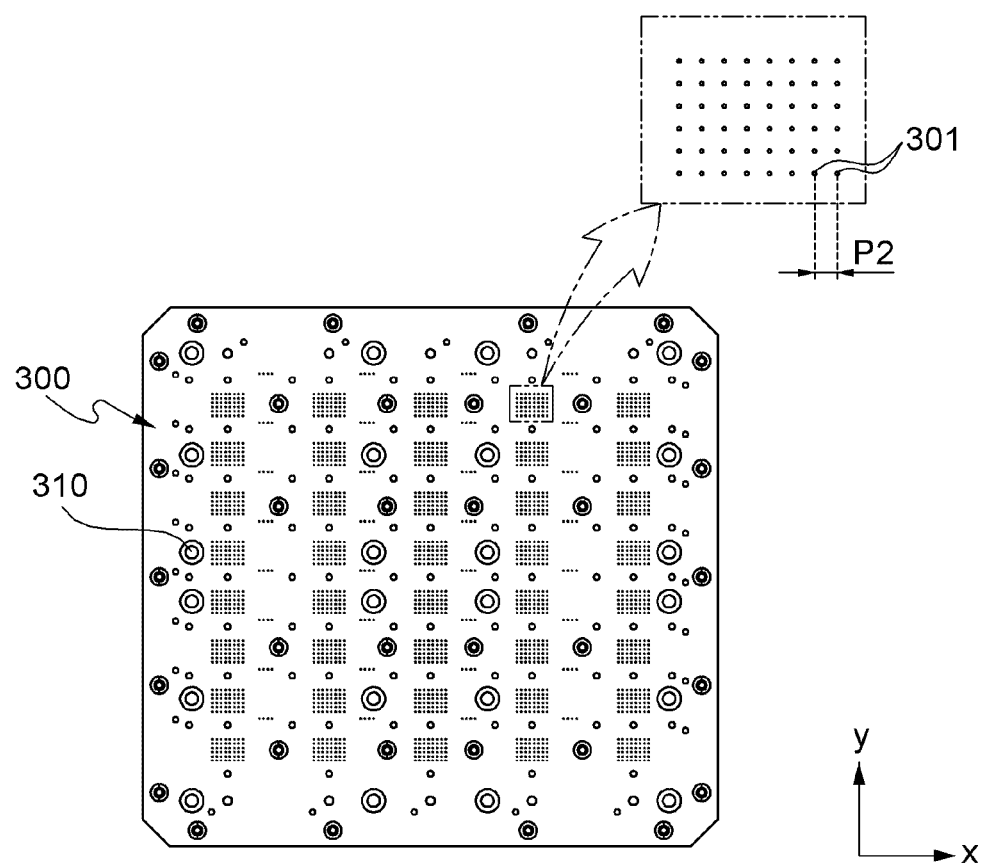
FIG. 7 is a view illustrating contact points arranged on the interposer.

Referring to FIGS. 4 and 5, the unit block 201 includes an insulation portion 210 and a conducting portion 220 (refer to FIG. 7). The insulation portion 210 may be a bar-type member having a hexahedral shape. The insulation portion 210 is manufactured by firing ceramic and is formed as a single member instead of a stack of several members. Accordingly, a process of manufacturing the block 200 is simpler and lower-priced than a process of manufacturing block by stacking several members.

The conducting portion 220 is disposed on the insulation portion 210 and electrically connects the probe pin 212 to the interposer 300.

The probe pins 212 are arranged on one surface of the conducting portion 220 in the vertical direction z.

An end of the probe pin 212 comes into contact with a pad of the object to be tested. The plurality of probe pins 212 may be arranged while being aligned by a fine pitch. In consideration of a shape of the insulation portion 210 formed to be lengthwise in a second direction y perpendicular to a first direction x, the plurality of probe pins 212 are arranged in a group by a fine pitch along the second direction y and such groups may be arranged at certain intervals along the second direction y.

For example, the conducting portion 220 includes a first surface 201a, a second surface 201b adjacent to the first surface 201a, and a third surface 201c adjacent to the second surface 201b and the probe pins 212 may be arranged on the first surface 201a. One group of probe pins 212 are arranged on one side of the first surface 201a, and another group of probe pins 212 may be arranged on the other side of the first surface 201a. Here, the ends of the probe pins 212 may be disposed to protrude further than the second surface 201b. The third surface 201c may be disposed to face the first surface 201a and be a surface in contact with the interposer 300.

Figure 6:
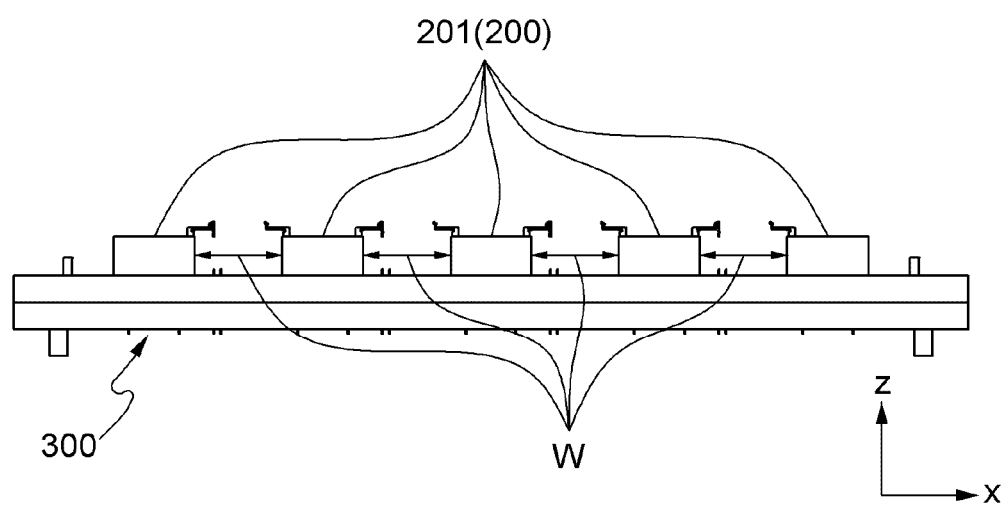
FIG. 6 is a side view illustrating an interposer and the unit blocks.

FIG. 6 is a side view illustrating the interposer 300 and the unit blocks 201.

Referring to FIG. 6, the unit blocks 201 are stacked on one surface of the interposer 300. Also, the unit blocks 201 may be arranged at the same intervals w in the first direction x. On the basis of the first direction x, the ends of the probe pins 212 may be located between the unit blocks 201.

Figure 8:
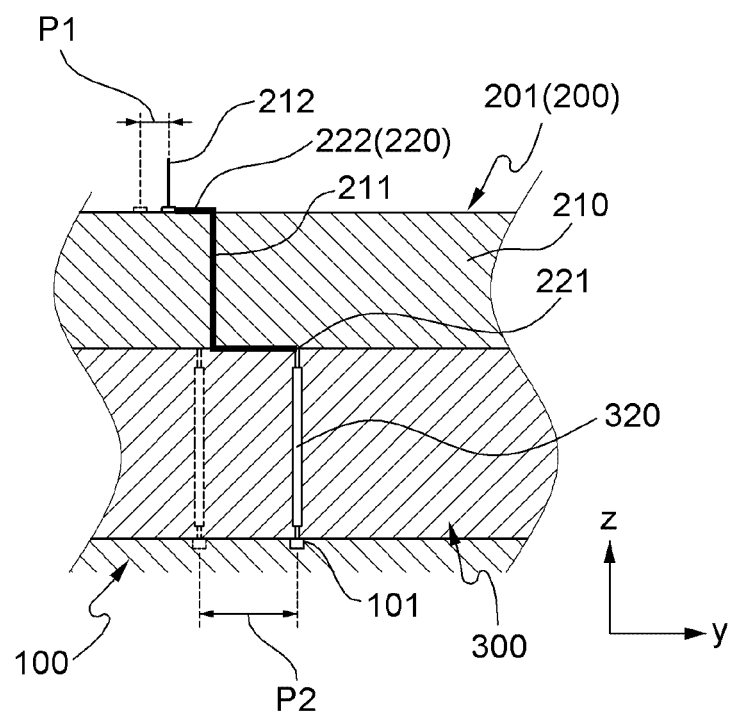
FIG. 8 is a side cross-sectional view of the probe card.

FIG. 7 is a view illustrating contact points 301 arranged on the interposer 300, and FIG. 8 is a side cross-sectional view of the probe card.

Referring to FIGS. 7 and 8, a plurality of such contact points 301 are arranged on the interposer 300. The contact points 301 are connected to conducting patterns 320 arranged on the interposer 300. A pitch between the contact points 301 corresponds to a pitch P2 between contact points 101 of the substrate 100. The interposer 300 may include a plurality of fastening holes 310. The fastening holes 310 are configured to allow the interposer 300 to be detachably coupled with the block 200.

Referring to FIG. 8, the insulation portion 210 may include a via 211. The via 211 is disposed while passing through one surface and the other surface of the insulation portion 210 on the basis of the vertical direction z. The via 211 may have a shape including a hole filled with a conducting pattern 222 thereinside or surrounded by the conducting pattern 222.

The conducting portion 220 may include a contact point 221. The contact point 221 is electrically connected to the substrate 100. When the interposer 300 is disposed, the contact point 221 is electrically connected to the conducting pattern 320 of the interposer 300. The corresponding contact point 221 may be disposed on the other surface of the conducting portion 220 in contact with the interposer 300. A pitch between the contact points 221 of the conducting portion 220 corresponds to the pitch P2 between the contact points 101 of the substrate 100.

The conducting portion 220 is electrically connected to the probe pin 212. The conducting pattern 222 of the block 200 may pass through the via 211 and connect the probe pin 212 to the contact point 221 so as to electrically connect the probe pin 212 and the substrate 100 and to compensate a pitch P1 between the probe pins 212 and the pitch P2 between the contact points 101 of the substrate 100.

The number and positions of the unit blocks 201 arranged on the interposer 300 may vary corresponding to a variety of positions of the pad of the object to be tested which come into contact with the probe pins 212. Although the unit blocks 201 are shown as including the same shape and size in the drawings, the present invention is not limited thereto and the unit blocks including different sizes and shapes may be combined and arranged on the interposer 300 according to the object to be tested. Accordingly, the block 200 has an advantage of performing a test corresponding to a variety of pitches of the contact points 221 of the object to be tested.

Figure 9:
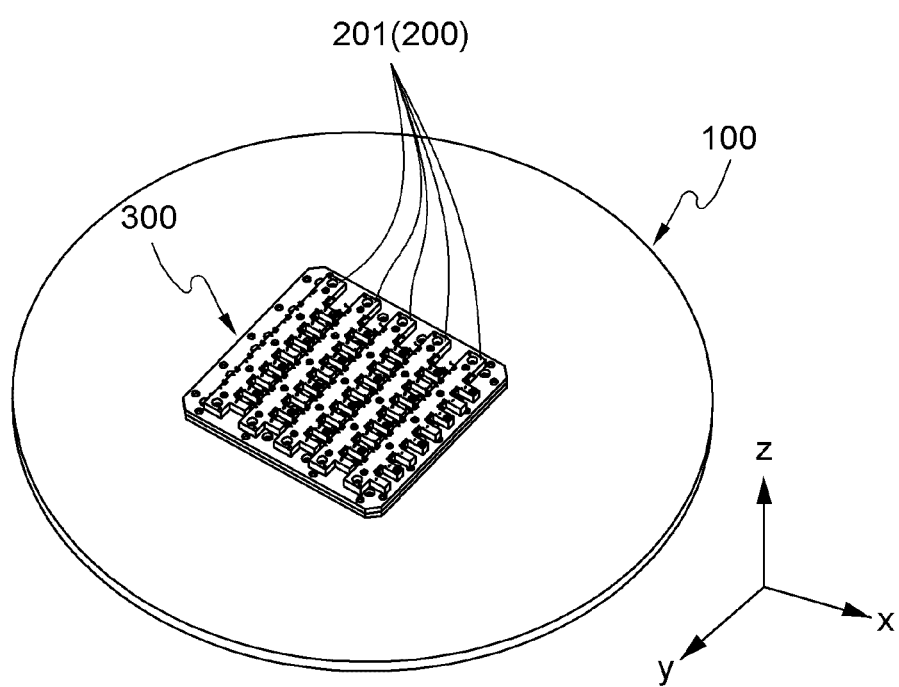
FIG. 9 is a view of a probe card according to another embodiment.
Figure 10:
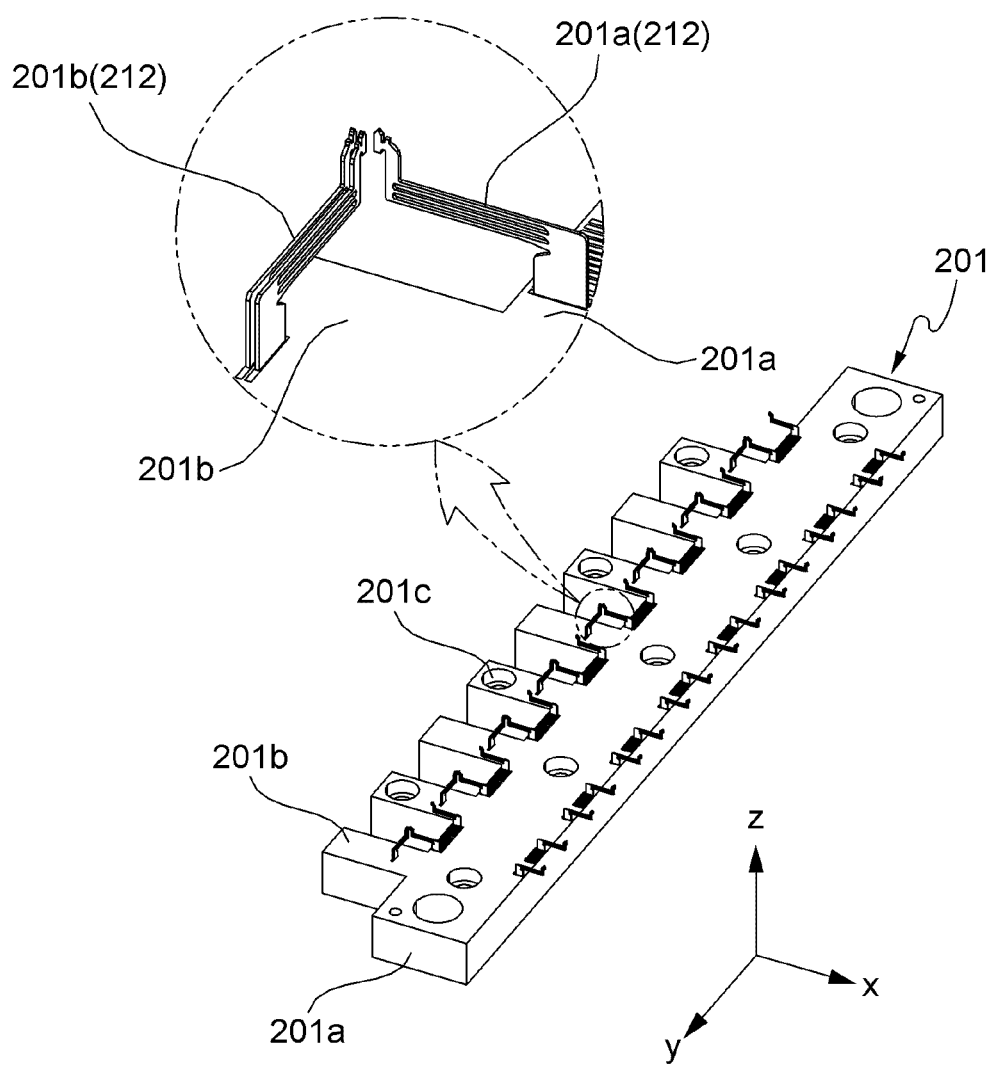
FIG. 10 is a view of unit blocks of the probe card shown in FIG. 9.

FIG. 9 is a view of a probe card according to another embodiment, and FIG. 10 is a view of the unit block 201 of the probe card shown in FIG. 9.

Referring to FIGS. 9 and 10, as the probe card according to another embodiment, the unit block 201 may include a body 201a and a plurality of extension portions 201b. The body 201a may be a bar-type member having a hexahedral shape. The body 201a may be formed to be lengthwise along a longitudinal direction and may be disposed so that the longitudinal direction becomes the second direction y.

The plurality of extension portions 201b diverge from the body 201a and are disposed. Each of the extension portions 201b may be disposed to be perpendicular to the body 201a. Each of the extension portions 201b may be arranged in the second direction y. The probe pins 212 may be arranged on the body 201a and the extension portions 201b.

The plurality of probe pins 212 arranged on the body 201a are arranged in the second direction y, and the plurality of probe pins 212 arranged on the extension portions 201b may be arranged in the first direction x.

Since the probe pins 212 are arranged on the extension portions 201b in addition to the body 201a, the probe pins 212 may be arranged in a more variety of positions so as to perform a test corresponding to a variety of pitches of the contact points 221 of the object to be tested.

Meanwhile, fastening holes 201c may be disposed in the extension portions 203b.

Figure 11:
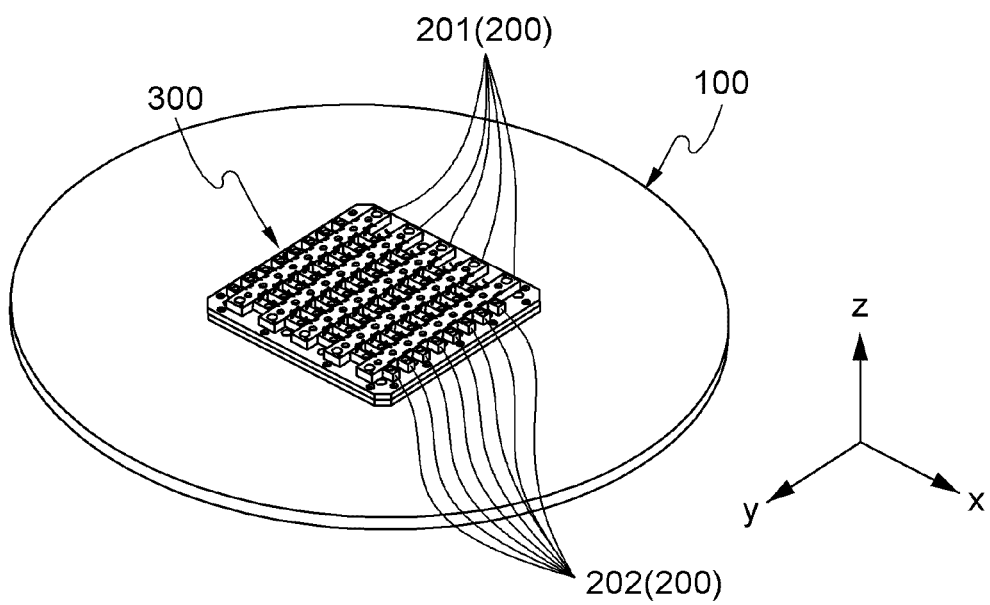
FIG. 11 is a view of a probe card according to still another embodiment.
Figure 12:
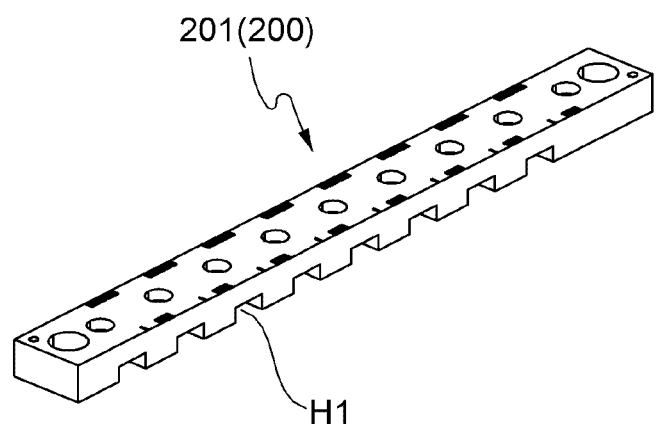
FIG. 12 is a view of a first unit block of the probe card shown in FIG. 11.
Figure 13:
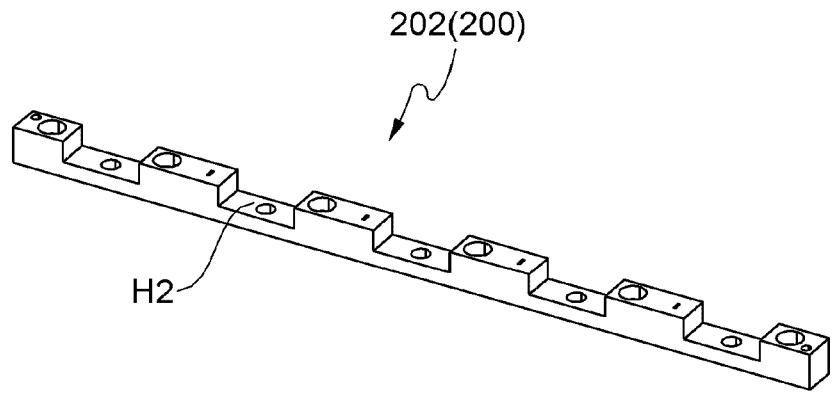
FIG. 13 is a view of a second unit block of the probe card shown in FIG. 11.

FIG. 11 is a view of a probe card according to still another embodiment, FIG. 12 is a view of a first unit block 201A of the probe card shown in FIG. 11, and FIG. 13 is a view of a second unit block 201B of the probe card shown in FIG. 11.

Referring to FIGS. 11 to 13, the probe card according to still another embodiment may include, as the unit block 201, the first unit block 201A and the second unit block 201B. Here, like the first unit block 201A, the second unit block 201B includes the insulation portion 210 and the conducting portion 220 which are the same components as those of the first unit block 201A and may have different positions and shapes therefrom.

The first unit block 201A and the second unit blocks 201B may be bar-type members having hexahedral shapes.

The first unit block 201A may be formed to be lengthwise along a longitudinal direction and may be disposed so that the longitudinal direction becomes the second direction y. A plurality of such first unit blocks 201A may be arranged at certain intervals in the first direction x.

The second unit block 201B may be formed to be lengthwise along a longitudinal direction and may be disposed so that the longitudinal direction becomes the first direction x. A plurality of such first unit blocks 201B may be arranged at certain intervals in the first direction x.

Figure 14:
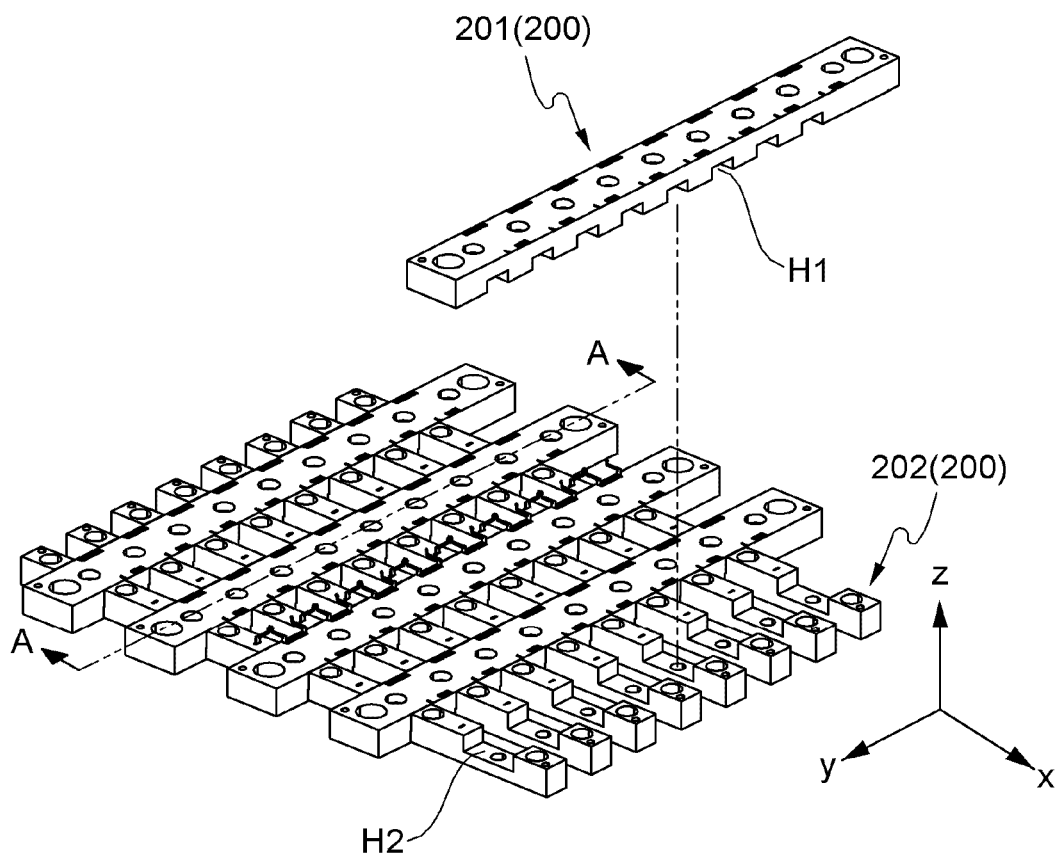
FIG. 14 is a perspective view illustrating a state in which the first unit blocks and the second unit blocks intersect and match with each other.
Figure 15:
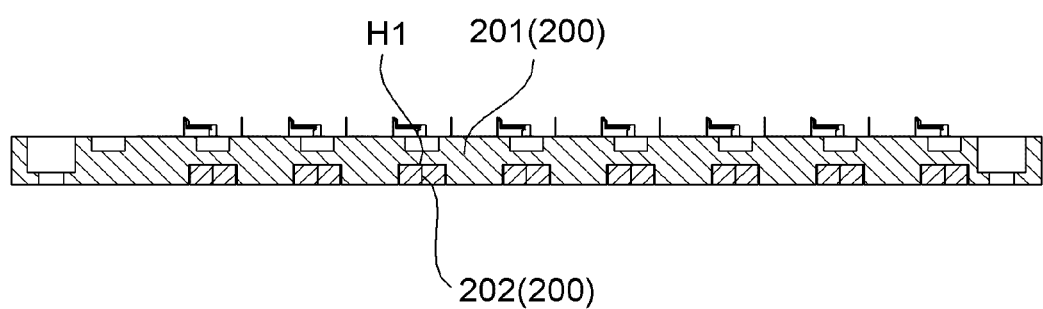
FIG. 15 is a side cross-sectional view illustrating the unit block taken along line A-A of FIG. 14.

FIG. 14 is a perspective view illustrating a state in which the first unit block and the second unit block intersect and match with each other, and FIG. 15 is a side cross-sectional view illustrating the unit block taken along line A-A of FIG. 14.

Referring to FIGS. 11 to 15, here, the first unit blocks 201A and the second unit blocks 201B may be disposed to intersect each other. In detail, the first unit block 201A and the second unit block 201B may be disposed so that intersection areas are overlapped in the vertical direction z.

The first unit block 201A may include a plurality of first grooves H1. The plurality of first grooves H1 may be concavely disposed on one surface of the first unit block 201A facing the second unit block 201B.

The second unit block 201B may include a plurality of second grooves H2. The plurality of second grooves H2 may be concavely disposed on one surface of the second unit block 201B facing the first unit block 201A. The first unit block 201A and the second unit block 201B may be arranged while intersecting and matching with each other. The first unit blocks 201A and the second unit blocks 201B may be arranged overall in a lattice shape.

Here, the first unit blocks 201A and the second unit blocks 201B may be disposed while intersecting and matching with each other to allow one surfaces of the first unit blocks 201A and one surfaces of the second unit blocks 201B to be located on the same level on the basis of the vertical direction z. Also, on the basis of the vertical direction z, the other surface of the first unit block 201A and the other surface of the second unit block 201B may be arranged to be located on the same level.

As described above, the probe card according to the exemplary embodiments of the present invention has been described in detail.

It should be noted that the above-described embodiments of the present invention are merely examples in all aspects and not intended to be limitative, and the scope of the present invention will be defined by the following claims rather than the above detailed description. Also, it should be construed that all changeable or modifiable forms derived from the meaning and scope of the claims and equivalents thereof are included in the scope of the present invention.

What is claimed is:

1. A probe card for testing a wafer, the probe card comprising:
    a substrate; and
    a block comprising an insulation portion and a conducting portion disposed on the insulation portion,
    wherein the insulation portion comprises a via and a probe pin which comes into contact with an object to be tested,
    wherein the conducting portion comprises a contact point electrically connected to the substrate and a conducting pattern passing through the via and electrically connecting the contact point to the probe pin,
    wherein a pitch between a plurality of such probe pins is smaller than a pitch between a plurality of such contact points,
    wherein the block comprises a plurality of unit blocks,
    wherein the plurality of unit blocks each comprise the insulation portion and the conducting portion, and at least parts of the insulation portions of the unit blocks are arranged while being spaced apart from each other,
    wherein, in the block, the unit blocks having a bar shape are arranged at certain intervals in a first direction,
    wherein the unit block comprises a body and a plurality of extension portions diverging from the body in the first direction, and
    wherein the probe pins are disposed on the body and the plurality of extension portions.

2. The probe card of claim 1, wherein the plurality of probe pins arranged on the body are arranged in a second direction different from the first direction, and
    wherein the plurality of probe pins arranged on the extension portions are arranged in the first direction.

3. A probe card for testing a wafer, the probe card comprising:
    a substrate; and
    a block comprising an insulation portion and a conducting portion disposed on the insulation portion,
    wherein the insulation portion comprises a via and a probe pin which comes into contact with an object to be tested,
    wherein the conducting portion comprises a contact point electrically connected to the substrate and a conducting pattern passing through the via and electrically connecting the contact point to the probe pin,
    wherein a pitch between a plurality of such probe pins is smaller than a pitch between a plurality of such contact points,
    wherein the block comprises a plurality of unit blocks,
    wherein the plurality of unit blocks each comprise the insulation portion and the conducting portion, and at least parts of the insulation portions of the unit blocks are arranged while being spaced apart from each other,
    wherein the unit blocks of the block comprise a first unit block and a second unit block,
    wherein a plurality of such first unit blocks are arranged at certain intervals in a first direction,
    wherein a plurality of such second unit blocks are arranged at certain intervals in a second direction different from the first direction,
    wherein the first unit blocks and the second unit blocks are arranged to intersect with each other,
    wherein the first unit block comprises a first groove,
    wherein the second unit block comprises a second groove, and
    wherein the first unit block and the second unit block are arranged to intersect and match with each other so that the first groove is engaged with the second groove.

4. A probe card for testing a wafer, the probe card comprising:
    a substrate; and
    a block comprising an insulation portion and a conducting portion disposed on the insulation portion,
    wherein the insulation portion comprises a via and a probe pin which comes into contact with an object to be tested,
    wherein the conducting portion comprises a contact point electrically connected to the substrate and a conducting pattern passing through the via and electrically connecting the contact point to the probe pin,
    wherein a pitch between a plurality of such probe pins is smaller than a pitch between a plurality of such contact points,
    wherein the block comprises a plurality of unit blocks,
    wherein the plurality of unit blocks each comprise the insulation portion and the conducting portion, and at least parts of the insulation portions of the unit blocks are arranged while being spaced apart from each other,
    wherein the unit blocks of the block comprise a first unit block and a second unit block,
    wherein a plurality of such first unit blocks are arranged at certain intervals in a first direction, wherein a plurality of such second unit blocks are arranged at certain intervals in a second direction different from the first direction, wherein the first unit blocks and the second unit blocks are arranged to intersect with each other, wherein the plurality of probe pins arranged on the first unit block are arranged in the second direction different from the first direction, and wherein the plurality of probe pins arranged on the second unit block are arranged in the first direction.

5. A probe card for testing a wafer, the probe card comprising:

a substrate; and a block comprising an insulation portion and a conducting portion disposed on the insulation portion, wherein the insulation portion comprises a via and a probe pin which comes into contact with an object to be tested, wherein the conducting portion comprises a contact point electrically connected to the substrate and a conducting pattern passing through the via and electrically connecting the contact point to the probe pin, wherein a pitch between a plurality of such probe pins is smaller than a pitch between a plurality of such contact points, wherein the block comprises a plurality of unit blocks, wherein the plurality of unit blocks each comprise the insulation portion and the conducting portion, and at least parts of the insulation portions of the unit blocks are arranged while being spaced apart from each other, wherein the unit block comprises a first surface on which the probe pins and some of the conducting patterns are arranged and a second surface adjacent to the first surface, and wherein ends of the probe pins are disposed to protrude further than the second surface.

* * * * *